(12) United States Patent
Sakurai et al.

(10) Patent No.: US 7,297,876 B2
(45) Date of Patent: Nov. 20, 2007

(54) CIRCUIT BOARD AND METHOD OF MANUFACTURING THE SAME

(75) Inventors: Daisuke Sakurai, Toyonaka (JP); Norihito Tsukahara, Soraku-gun (JP); Kazuhiro Nishikawa, Mishima-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 146 days.

(21) Appl. No.: 10/918,274

(22) Filed: Aug. 13, 2004

(65) Prior Publication Data
US 2005/0045379 A1   Mar. 3, 2005

(30) Foreign Application Priority Data
Aug. 29, 2003 (JP) ............................. 2003-306666

(51) Int. Cl.
*H05K 1/16* (2006.01)
(52) U.S. Cl. ....................... 174/260; 174/261
(58) Field of Classification Search ............... 174/260, 174/261; 361/760
See application file for complete search history.

(56) References Cited

U.S. PATENT DOCUMENTS 5,366,906 A * 11/1994 Wojnarowski et al. ........ 438/17
5,875,100 A * 2/1999 Yamashita ................... 361/764
6,038,133 A * 3/2000 Nakatani et al. ............. 361/760
6,300,686 B1 * 10/2001 Hirano et al. ................ 257/783
6,512,182 B2 * 1/2003 Takeuchi et al. ............. 174/256
6,623,844 B2 * 9/2003 Nishimoto .................... 428/209
6,709,897 B2 * 3/2004 Cheng et al. ................. 438/121
6,768,064 B2 * 7/2004 Higuchi et al. ............... 174/267
6,909,054 B2 * 6/2005 Sakamoto et al. ........... 174/260
7,087,991 B2 * 8/2006 Chen et al. ................... 257/700

FOREIGN PATENT DOCUMENTS

JP 62-70473 5/1987
JP 2001-093934 4/2001

* cited by examiner

*Primary Examiner*—Ishwar (I. B.) Patel
(74) *Attorney, Agent, or Firm*—RatnerPrestia

(57) ABSTRACT

Apply heat to thermoplastic resin film, which is eventually to become an insulating resin layer, and press the film against a mold for forming grooves on a surface of the film. Next, press-fit an electronic component into the resin film from a back-face of the film, thereby exposing electrodes of the component from a bottom of the grooves. Then cool the film for curing. Peel the film off the mold, then fill the grooves with conductive paste, and cure the paste for forming circuit patterns. The foregoing procedure allows bringing the electrodes positively into conduction with the circuit patterns of a circuit board incorporating the electronic component, and achieving a narrower pitch between routings of the circuit patterns.

6 Claims, 10 Drawing Sheets

CIRCUIT BOARD AND METHOD OF MANUFACTURING THE SAME

FIELD OF THE INVENTION

The present invention relates to a circuit board incorporating electronic components and a method of manufacturing the same circuit board.

BACKGROUND OF THE INVENTION

In recent years, narrower pitches of circuit patterns of circuit boards have been required in the market in order to increase a board density. In parallel with this tendency, a circuit board incorporating electronic components therein is proposed. The circuit board incorporating electronic components, in particular, is required to have a further narrower pitch in circuit patterns.

Japanese Utility Model Publication No. S62-70473 discloses a method of avoiding short circuits in a circuit having a narrow pitch: forming grooves on an insulated board, and then filling the grooves with conductive paste for forming a circuit, thereby avoiding short-circuits. However, this utility model does not teach at all about incorporating electronic components in the board per se.

On the other hand, Japanese Patent Application Non-Examined Publication No. 2001-93934 discloses a method of manufacturing a circuit board incorporating electronic components as follows: First, press-fit an electronic component into insulating resin, and expose electrodes of the component from a flat surface of the opposite side of the resin. Next, print a circuit pattern on the flat surface, thereby coupling the component with the pattern. However, since circuit patterns with narrow pitches are formed on the flat face of the circuit board manufactured by this method, a short circuit tends to occur between the circuit patterns.

SUMMARY OF THE INVENTION

The present invention addresses the problem discussed above, and aims to provide a circuit board with a circuit pattern having a narrower pitch free from short circuits and a method of manufacturing the same circuit board, which has a higher density and more sophistication besides the foregoing advantage.

The circuit board of the present invention comprises the following elements:
  an insulating resin layer of which surface has grooves corresponding to circuit patterns;
  electronic components disposed interior the insulating resin layer, and having electrodes exposed from the bottom of the grooves; and
  a circuit pattern formed in the grooves.

The method of manufacturing the same circuit board comprising:
  forming grooves corresponding to a circuit pattern on a surface of the insulating resin layer;
  press-fitting an electronic component into the insulating resin layer from the back face opposite to the surface, on which the grooves are formed, such that electrode terminals of the component expose themselves from the bottom of the grooves; and
  forming an electrode-layer in the grooves.

The foregoing structure allows forming the circuit patterns in the grooves formed on the surface of the insulating resin layer, so that routings of the pattern are positively isolated by the insulating resin layer. As a result, short circuits between the routings of the circuit pattern can be prevented. The electrodes of the electronic component press-fitted from the back face of the insulating resin layer become positively conductive with the circuit pattern at the bottom of the grooves. This preparation allows a narrower pitch between the routings of the circuit pattern of the circuit board incorporating the electronic components.

DETAILED DESCRIPTION OF EXEMPLARY EMBODIMENTS

Exemplary embodiments of the present invention are demonstrated hereinafter with reference to the accompanying drawings. Similar elements to those of other embodiments have the same reference marks, and the descriptions thereof are sometimes omitted.

Exemplary Embodiment 1

Figure 1:
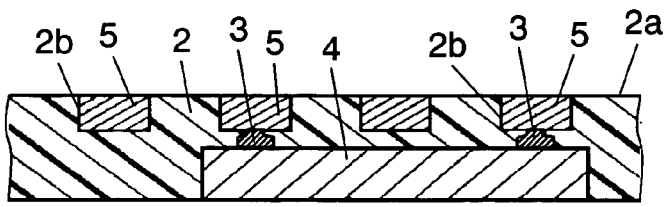
FIG. 1 shows a sectional view of a circuit board in accordance with a first exemplary embodiment of the present invention.
Figure 2:
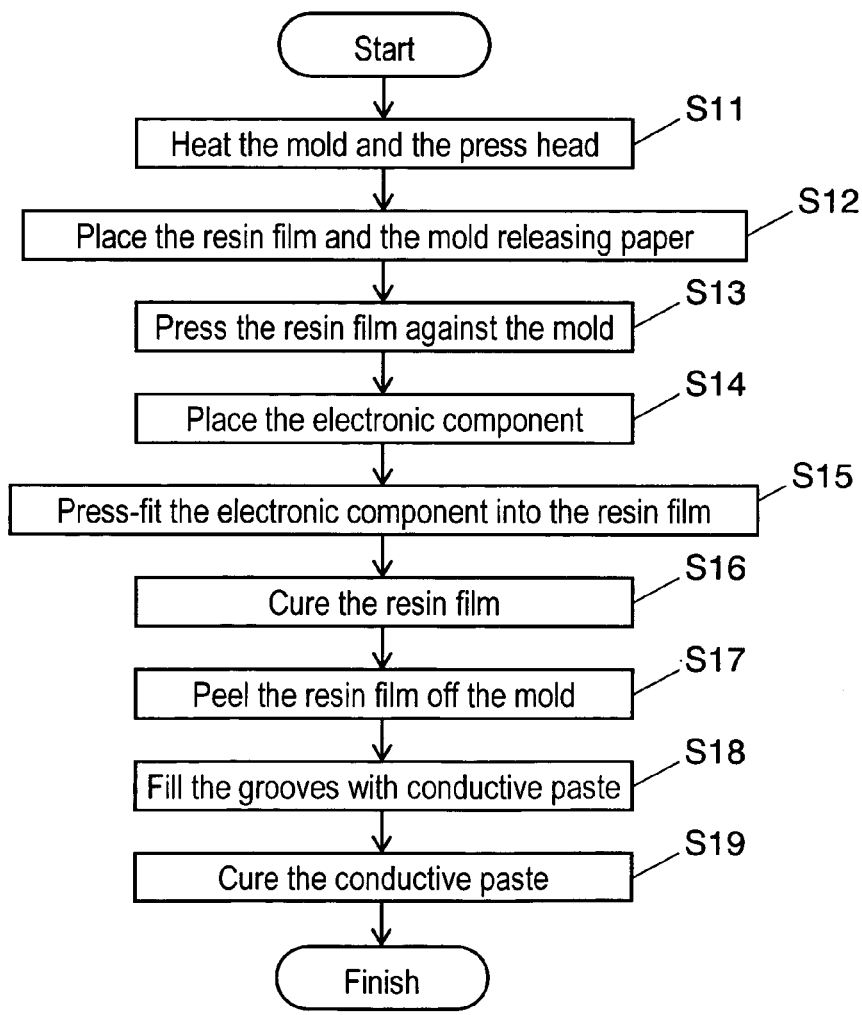
FIG. 2 shows a flowchart illustrating steps of a manufacturing method of the circuit board in accordance with the first embodiment.

The circuit board and the method of manufacturing the same board in accordance with the first embodiment of the present invention are demonstrated with reference to FIG. 1 through FIG. 10. FIG. 1 shows a sectional view of a circuit board in accordance with the first exemplary embodiment of the present invention. FIG. 2 shows a flowchart illustrating steps of a manufacturing method of the circuit board in accordance with the first embodiment. FIG. 3 through FIG. 10 show sectional views illustrating respective steps of the manufacturing method of the circuit board in accordance with the first embodiment.

Circuit board 1 shown in FIG. 1 comprises the following elements:
  insulating resin layer 2 of which surface 2a has grooves 2b corresponding to circuit patterns;
  electronic component 4 disposed inside insulating resin layer 2 and electrode terminals 3 of the component are exposed from a bottom (a section generally understood as a bottom) of grooves 2b; and
  circuit patterns 5 formed in grooves 2b, and preferably formed of conductive paste filled into grooves 2b and cured.

Insulating resin layer 2 can be made of thermoplastic resin, thermosetting resin, or photo-setting resin.

A shape of electrode terminals 3 of electronic component 4 is not limited to a specific one; however, it is preferable to be a projecting electrode as shown in FIG. 1, because the electrode extends through the insulating resin layer and exposes itself from the bottom of grooves 2b. Electrode terminals 3 can be formed by plating, and this is detailed later, or by a wire-bump method. Electronic component 4 can be any component, e.g. integrated circuit such as an IC, or chip component such as a resistor and a capacitor, as far as it has projecting electrode terminals. A type or a shape of the component is not specifically limited.

Insulating resin layer 2 formed of thermoplastic resin is taken as an example of manufacturing circuit board 1, and this manufacturing method is demonstrated hereinafter with reference to the flowchart in FIG. 2 and sectional views of FIG. 3-FIG. 9 illustrating steps of the manufacturing method.

Figure 3:
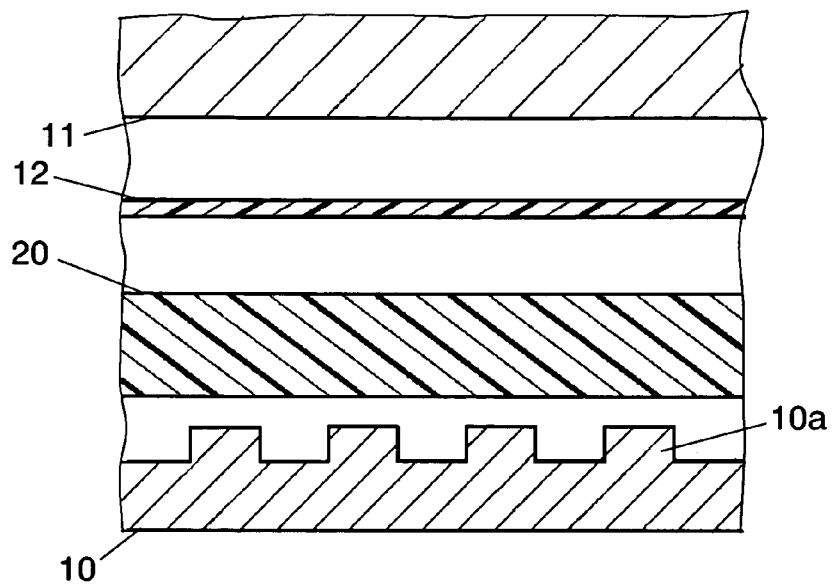
FIG. 3 shows a sectional view illustrating a step of the manufacturing method of the circuit board in accordance with the first embodiment, where a mold releasing paper and a resin film are disposed between a press head and a mold.

FIG. 3 shows a preparation step for forming grooves 2b on thermoplastic resin film 20 which is to be insulating resin layer 2. Prepare press-head 11 and mold 10 having protrusions 10a reversal to grooves 2b formed on insulating resin layer 2 shown in FIG. 1. First, heat mold 10 and press-head 11 (step S11) at a temperature not lower than the softening point of resin film 20 (e.g. 200° C.). Next, place thermoplastic resin film 20 and mold releasing paper 12 in this order from mold 10 toward press head 11 (step S12).

Thermoplastic resin film 20 is, e.g. a sheet of film made of polyethylene terephthalate glycol modified (PETG) of which softening point is 200° C. The sheet has dimensions of 200 mm (long), 200 mm (wide) and 200 μm (thick). Other thermoplastic resin to be used as resin film 20 are, e.g. polypropylene, polyethylene terephthalate, or acrylonitrile butadiene styrene. Mold releasing paper 12 can be made of Teflon® of 100 μm thickness, or, e.g. polytetrafluoro-ethylene, tetra-fluoroethyuelene perfluoro alkylvinyl ether mixed polymer, or polyimide.

Figure 4:
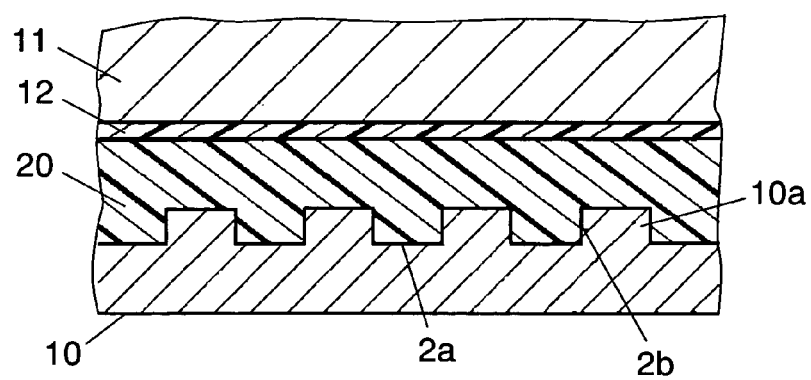
FIG. 4 shows a sectional view illustrating a step of the manufacturing method of the circuit board in accordance with the first embodiment, where the resin film is pressed against a mold having peaks and valleys by the press head via the mold releasing paper.

Next, as shown in FIG. 4, press resin film 20 against mold 10 having protrusions 10a via mold releasing paper 12 by press head 11 at a given pressure and for a given time (step S13). Each one of protrusions 10a is shaped like, e.g. 200 μm wide and 20 μm high. This pressing condition is preferably 0.5-1.5 kgf/mm² and 120-140 seconds. The pressure must be carefully applied not to leave bubbles. To be more specific, load and temperature are gradually increased for the first 60 seconds, then the load and temperature are maintained for the next 60 seconds. This procedure allows forming grooves 2b, of which shape is reversal to protrusions 10a of mold 10, on surface 2a of resin film 20.

Figure 5:
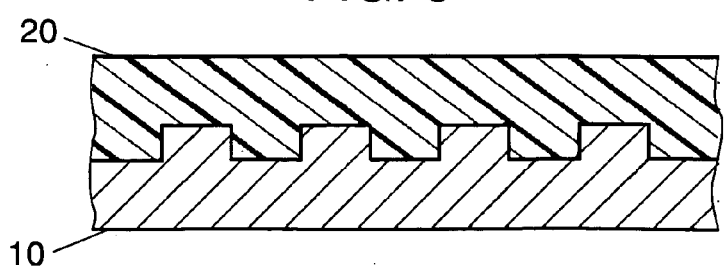
FIG. 5 shows a sectional view illustrating a step of the manufacturing method of the circuit board in accordance with the first embodiment, where the press head and the mold releasing paper are removed.

Then as shown in FIG. 5, mount resin film 20 on mold 10, and remove press head 11 and mold releasing paper 12 with the temperature maintained over the softening point. Resin film 20 can be cooled forcibly or naturally in removing mold releasing paper 12 to reduce its temperature lower than the softening point temporarily. This preparation allows resin film 20 to keep its shape steadily. It is preferable to spray release agent in advance on the surface of mold 10 including protrusions 10a because this preparation results in easier release of resin film 20 from mold 10.

Figure 6:
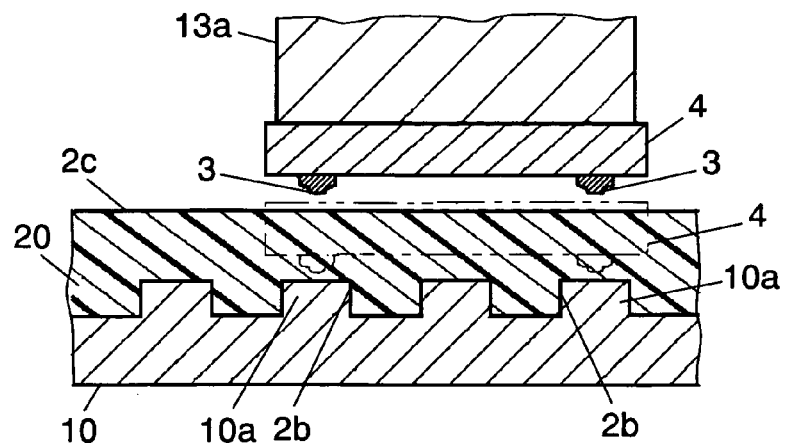
FIG. 6 shows a sectional view illustrating a step of the manufacturing method of the circuit board in accordance with the first embodiment, where an electronic component is sucked and held by a chuck, and the electronic component in this state is pressed against the mold for being press-fitted into the resin film.

Following the foregoing procedure, as shown in FIG. 6, place electronic component 4 sucked and held by chuck 13a toward back face 2c of resin film 20 (back face 2c is an opposite face to the grooved face), then position component 4 such that electrode terminals 3 of component 4 face grooves 2b on resin film 20 (step S14). In this embodiment, electronic component 4 is, e.g. an IC chip. This IC chip has a bare-chip structure, and dimensions of 6 mm square, 160 µm thickness. Electrode terminals 3 made of gold (Au) are formed on the circuited face in a quantity of 50. Electrode terminals 3 are stud-bumps, each one of which has two steps having different diameters, namely, the surface of the IC chip is 80 µm across and 20 µm high, and the second step formed thereon is 40 µm across and 60 µm high. In other words, the total height of electrode terminal 3 is 80 µm.

After the positioning in step S14, as shown in FIG. 6 with alternate long and two short dashes lines, move chuck 13a downward, so that component 4 is press-fitted into resin film 20. If component 4 can be press-fitted without positional deviation in the next press step, component 4 can be only partially press-fitted in this step, or it can be press-fitted until it touches mold 10.

Figure 7:
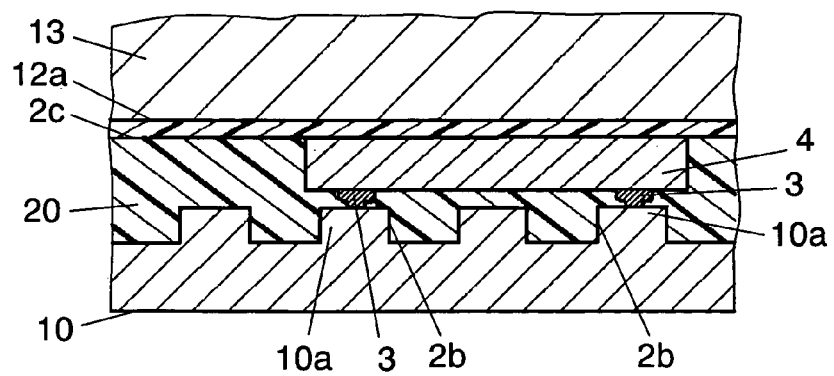
FIG. 7 shows a sectional view illustrating a step of the manufacturing method of the circuit board in accordance with the first embodiment, where the electronic component is further press-fitted into the resin film by the press head via the mold releasing paper.

After the press-fit of component 4 into resin film 20, further press-fit component 4 into resin film 20 by press head 13 as shown in FIG. 7 via mold releasing paper 12a. For instance, apply load of 40-50 kgf and press component 4 until its electrode terminals 3 expose themselves from the bottom of grooves 2b. To be more specific, press-fit component 4 further into resin film 20 with resin film 20 pressed against mold 10 until electrode terminals 3 are brought into substantially contact with projections 10a and the stud-bumps of terminals 3 are partially deformed (step S15). At this time, heat resin-film 20, e.g. up to 150-170° C. for 20-150 seconds. To be more specific, heat resin-film 20 up to 150-170° C. for the first 5 seconds, and keep the temperature until a given time lapses. Then cool resin film 20 with component 4 pressed against film 20 by press head 13 before resin film 20 is deformed, and then cure resin film 20 (step S16). Cool resin film 20 down to, e.g. 110° C. and cure it, then peel film 20 off mold 10 (step S17).

Figure 8:
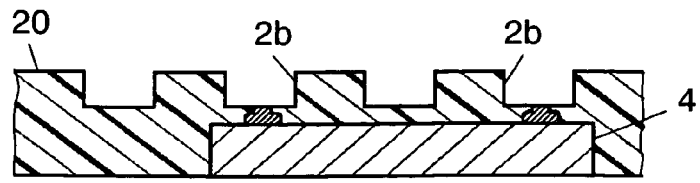
FIG. 8 shows a sectional view illustrating a step of the manufacturing method of the circuit board in accordance with the first embodiment, where the press head, mold releasing paper, and mold are removed, and the resin film incorporating the electronic component is turned upside down, so that the grooves face upward.
Figure 9:
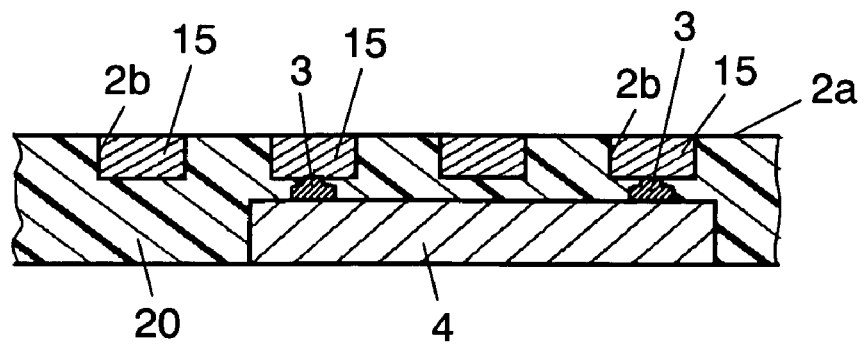
FIG. 9 shows a sectional view illustrating a step of the manufacturing method of the circuit board in accordance with the first embodiment, where the grooves on the resin film are filled with conductive paste, so that a circuit pattern is formed.

Then as shown in FIG. 8, turn resin film 20 upside down, and place it with grooves 2b facing upward. Further, as shown in FIG. 9, fill grooves 2b on surface 2a of resin film 20 with thermosetting conductive paste 15 using a screen printing method (step S18). Apply heat to conductive paste 15 up to a temperature lower than the softening point of resin film 20, e.g. 110° C., for curing paste 15. This process forms circuit pattern 5 shown in FIG. 1 (step S19). A mask used at the screen printing has dimensions of 160 µm aperture width and 20-30 µm film thickness after the print. A squeegee having 70° hardness is used at the printing. It is held at an angle of 60-80° and moved at a speed of 15-100 mm/s under a pressure of 0.4-1.5 kgf/mm² for printing the conductive paste.

It is preferable to cure paste 15 by applying a pressure to paste 15 with a jig. For instance, a metal jig, of which flat face is kept at a temperature of 110° C., is used for applying a pressure of 0.5-1.5 kgf/mm² for about 10 minutes. When photo-setting conductive paste 15 is used, irradiate paste 15 with the light such as ultraviolet ray for curing, then circuit board 1 is obtained. When grooves 2b are filled with paste 15, an ink-jet method or a dispense method can be used instead of the screen printing method.

Tips of electrode terminals 3 of component 4 expose themselves from the bottom of grooves 2b, so that cure of paste 15 makes terminals 3 and circuit pattern 5 conductive with each other. As a result, resin film 20 becomes insulating resin layer 2 shown in FIG. 1. Layer 2 incorporates component 4, and the circuit patterns are formed in grooves 2b, so that circuit board 1 shown in FIG. 1 is obtainable.

Material of mold 10 is not limited to a specific one; however, it is preferable to use metal having a large heat conductivity and rigidity, such as stainless-steel (SUS), because heating and pressing by press heads 11, 13 are needed for softening layer 2. Since quartz glass has a high rigidity, it can be used as mold 10.

In this embodiment, the following material is used as conductive paste 15: flaked Ag, or metal filler shaped like fine beads are filled in thermosetting resin having shrink characteristics (e.g. epoxy resin of which curing temperature is 110° C. and curing time is 10 minutes). Heating and curing of the conductive paste shrink the thermosetting resin, and bring metal fillers into contact with each other, so that excellent conductivity is obtainable. The metal filler included in paste 15 can be Cu, Ni, Pd, or Au. The conductive paste can be photo-setting paste. Grooves 2b can be partially filled with paste of resistant material or dielectric material. Further, the conductive paste can be thermoplastic paste or low-temperature baked paste.

As discussed above, in the manufacturing steps of circuit board 1, use of mold 10 facilitates forming grooves 2b. When component 4 is press-fitted into thermoplastic resin film 20, projections 10a of mold 10 are placed toward electrode terminals 3, so that tips of terminals 3 can be exposed from the bottom of grooves 2b. This structure allows electrode terminals 3 to become positively conductive with circuit patterns 5. Circuit patterns 5 are formed inside grooves 2b formed on surface 2a of insulating resin layer 2, so that the routings of patterns 5 are positively isolated by layer 2. Thus a short circuit between circuit patterns 5 can be prevented. As a result, a narrower pitch between the routings of circuit patterns 5 is achievable.

After the press-fit of component 4, circuit patterns 5 can be formed before layer 2 is completely cured, so that the manufacturing time of circuit board 1 can be shortened.

The flowchart shown in FIG. 2 illustrates a case where insulating resin layer 2 is formed of thermoplastic resin; however, thermosetting resin or photo-setting resin can be used instead of thermoplastic resin. In such a case, mold 10 and press head 13 are not heated in step S11. In other words, resin film 20 is pressed against mold 10, and component 4 is press-fitted into film 20 (step S12-S15), then resin film 20 is cured by heating or photo irradiation instead of cooling (step S16). Then resin film is peeled off mold 10, and grooves 2b are filled with conductive paste 15, which is then cured (step S17-S19).

When photo-setting resin film 20 is used, mold 10 is formed of photo-conductive material for curing, or resin film 20 is irradiated with the light just before the press-fit of component 4 in order to start curing, and resin film 20 is completely cured after the press-fit.

Figure 10:
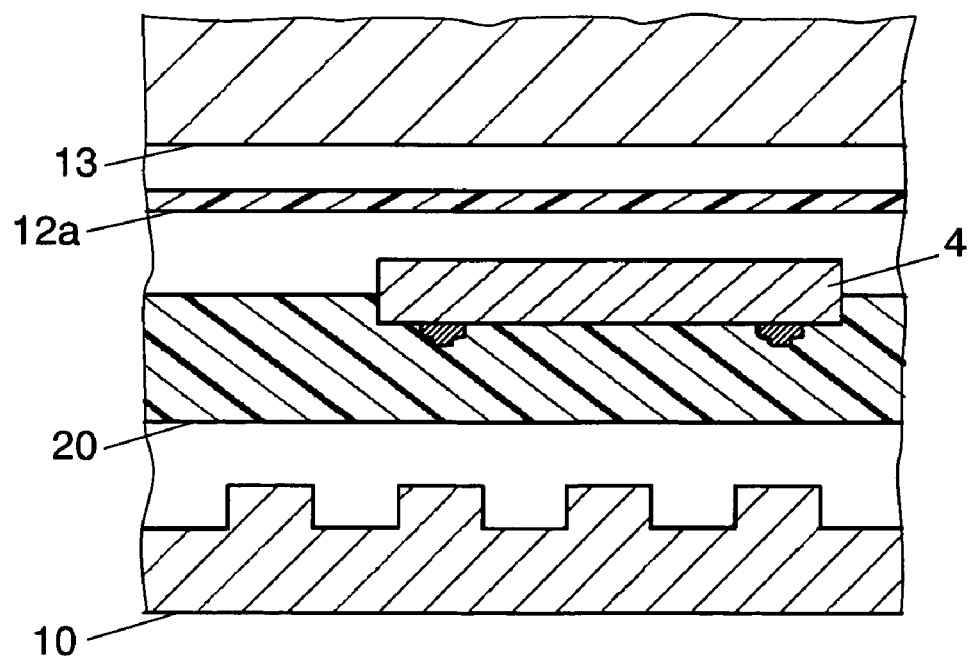
FIG. 10 shows a sectional view illustrating a step of a modified manufacturing method of the circuit board in accordance with the first embodiment. The method presses a resin film against a mold, and at the same time, an electronic component is press-fitted into the resin film, and in this step, a mold releasing paper, the electronic component, and the resin film are disposed between a press head and the mold.

In FIG. 2, resin film 20 is firstly pressed against mold 10 (step S13), then component 4 is press-fitted (step S15); however, this order can be reversed. Circuit board 1 can be manufactured as shown in FIG. 10, which shows a manufacturing method modified from that in accordance with this embodiment. First, temporarily press-fit electronic component 4 onto resin film 20, then place mold releasing paper 12a and press head 13 above resin film 20 made of whichever resin of thermoplastic, thermosetting, or photo-setting. Mold 10 is placed under film 20. Then press softened film 20 against mold 10 (step S13), at this time, component 4 can be press-fitted into film 20 simultaneously (step S15). This method can further shorten the manufacturing time of circuit board 1. In this modified method, when steps S13 and S15 are simultaneously carried out, component 4 and mold 10 can be mechanically positioned and retained, so that positional alignment between electrode terminals 3 and projections 10a of mold 10 can be done with ease.

On the other hand, liquid thermosetting resin or liquid photo-setting resin can be used instead of thermosetting or photo-setting resin film 20. In this case, instead of step S11-S13, apply the resin to mold 10, and press-fit component 4 into the resin via the mold releasing paper (steps S14, S15). Then cure the thermosetting or photo-setting resin (step S16), and carry out the procedures shown in FIG. 2 for forming circuit patterns 5 in grooves 2b (steps S17-S19).

Exemplary Embodiment 2

Figure 11:
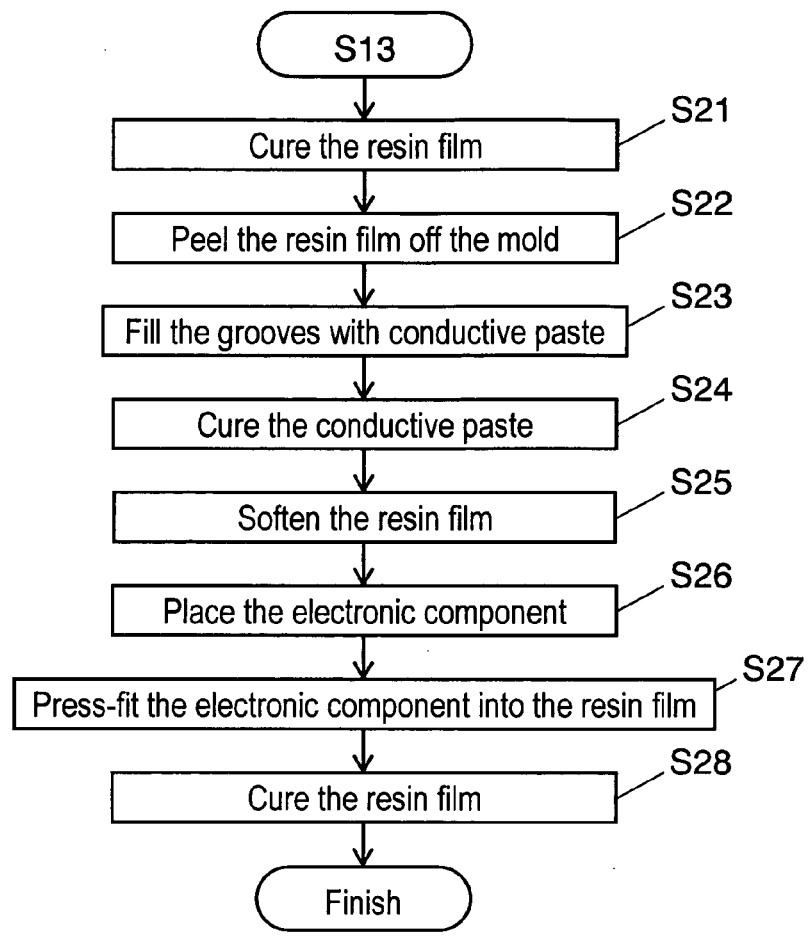
FIG. 11 shows a flowchart illustrating steps of a manufacturing method of a circuit board in accordance with a second exemplary embodiment of the present invention.
Figure 12:
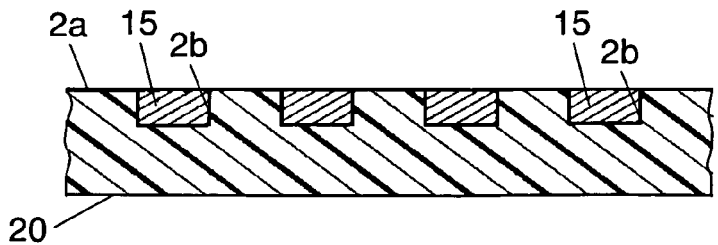
FIG. 12 shows a sectional view illustrating a step of the manufacturing method of the circuit board in accordance with the second embodiment, where grooves formed on a resin film are filled with conductive paste, so that a circuit pattern is formed.
Figure 13:
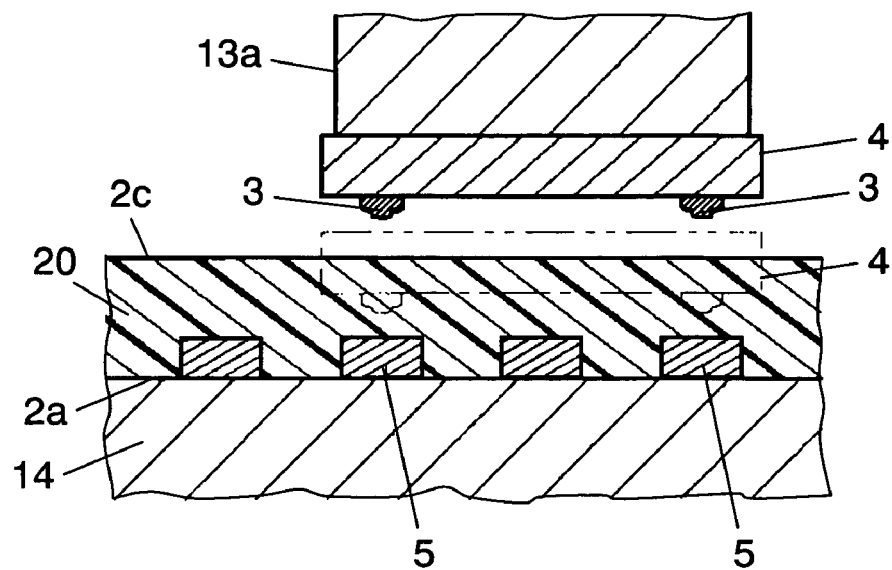
FIG. 13 shows a sectional view illustrating a step of the manufacturing method of the circuit board in accordance with the second embodiment, where a face, having a circuit pattern, of the resin film is placed toward a base-plate, and an electronic component is sucked and held by a chuck. The electronic component in this state is press-fitted into the resin film.
Figure 14:
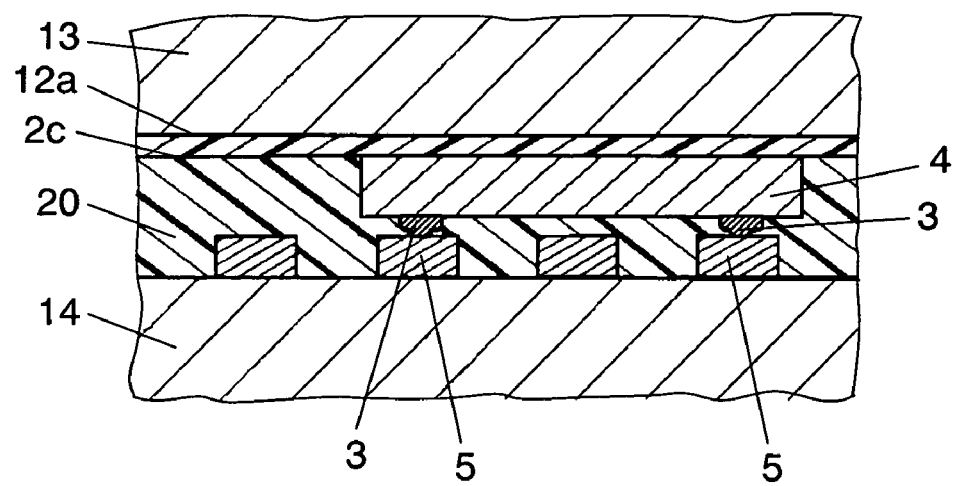
FIG. 14 shows a sectional view illustrating a step of the manufacturing method of the circuit board in accordance with the second embodiment, where a press head is disposed via mold releasing paper, so that the electronic component is further press-fitted into the resin film.

The manufacturing method in accordance with the second exemplary embodiment of the present invention is demonstrated hereinafter with reference to FIG. 11-FIG. 14. Steps common to those of the first embodiment are described with reference to FIG. 2 and FIG. 4 already described in the first exemplary embodiment. This manufacturing method relates to a method of manufacturing a circuit board of which insulating resin layer is formed of thermoplastic resin. FIG. 11 shows a flowchart illustrating steps of the manufacturing method in accordance with the second embodiment. FIG. 12-FIG. 14 show sectional views illustrating respective steps of the manufacturing method. Similar elements to those in the first embodiment have the same reference marks. Steps S11-S13 described in the first embodiment are common to this second embodiment, thus the flowchart in FIG. 11 only shows the steps after step S13.

As shown in FIG. 4, press thermoplastic resin film 20, which is to be insulating resin layer 2, against mold 10 for forming grooves 2b (step S13). Next, remove press head 11 and a sheet of mold releasing paper, then stop heating mold 10 for curing film 20 forcibly or naturally (step S21). Then peel film 20 off mold 10, and turn film 20 upside down (step S22).

Next, as shown in FIG. 12, fill grooves 2b formed on surface 2a of resin film 20 with conductive paste 15 (step S23), and cure paste 15 by heating or photo irradiation for forming circuit patterns (step S24).

Then as shown in FIG. 13, face circuited surface 2a downward, and place resin film 20 on base plate 14. Heat base-plate 14 for re-softening film 20 (step S25). In this state, place component 4 sucked by chuck 13a to face back-face 2c of insulating resin layer 2 (step S26), and move chuck 13a downward as shown with an alternate long and two short dashes line in FIG. 13 to press-fit component 4 into resin film 20.

After the press-fit of component 4 into film 20, place mold-releasing paper 12a and press head 13 on component 4 as shown in FIG. 14. Then press-fit component 4 further into film 20 from back face 2c by press head 13 until electrode terminals 3 of component 4 extend through film 20 to reach circuit patterns 5 (step S27). Next, cool film 20 with component 4 pressed against film 20 by press head 13 for re-curing film 20. This procedure allows film 20 to become insulating resin layer 2 shown in FIG. 1, and circuit board 1 is thus produced (step S28).

In the manufacturing method shown in FIG. 11, the step of forming circuit patterns 5 by filling and curing paste 15 is carried out before the step of press-fitting component 4 into film 20. This order is achievable by using the property of the thermoplastic resin, and this order allows electrode terminals 3 to be positively conductive with circuit patterns 5.

In FIG. 11, step S24 of curing the conductive paste can be omitted, namely, when film 20 is heated for re-softening and component 4 is press-fitted into film 20 (steps S25-S27), thermosetting conductive paste 15 can be cured at the same time. This procedure shortens the manufacturing time of circuit board 1, and heating in applying a pressure increases a density of filler, so that the circuit patterns advantageously have less resistance.

Exemplary Embodiment 3

Figure 15:
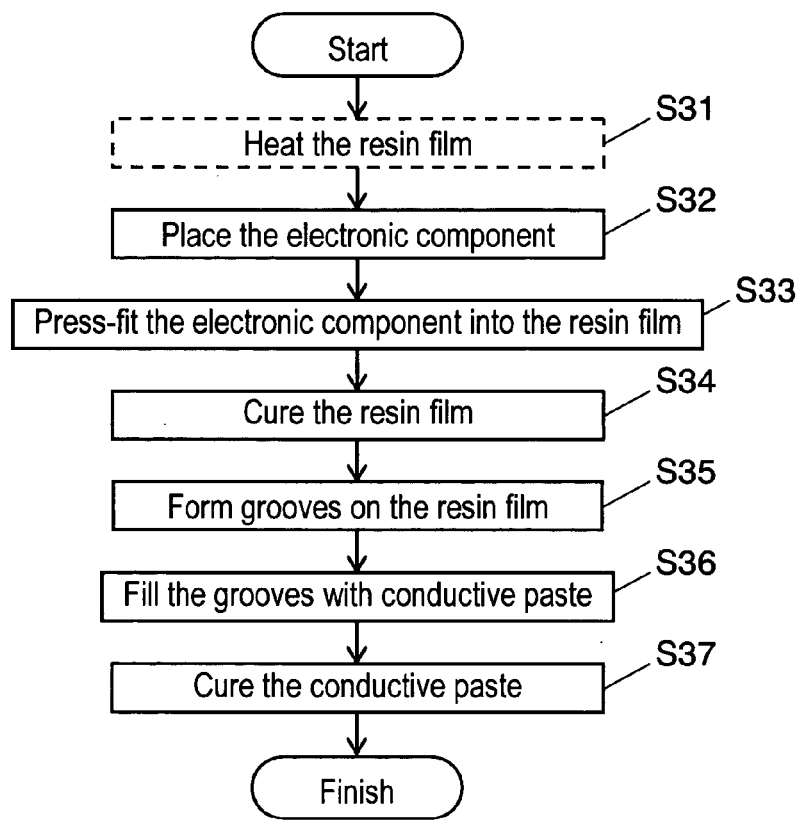
FIG. 15 shows a flowchart illustrating steps of a manufacturing method of a circuit board in accordance with a third exemplary embodiment of the present invention.

The manufacturing method in accordance with the third exemplary embodiment of the present invention is demonstrated hereinafter with reference to FIG. 15-FIG. 19. Steps common to those of the first embodiment are described with reference to FIGS. 1, 2 and 9 already described in the first embodiment. FIG. 15 shows a flowchart illustrating steps of the manufacturing method in accordance with the third embodiment. FIG. 16-FIG. 19 show sectional views illustrating respective steps of the manufacturing method. Similar elements to those in the first and second embodiments have the same reference marks. In the manufacturing method shown in FIG. 15, insulating resin layer 2 of circuit board 1 is not limited to thermoplastic resin, but thermosetting resin or photo-setting resin can be used.

Figure 16:
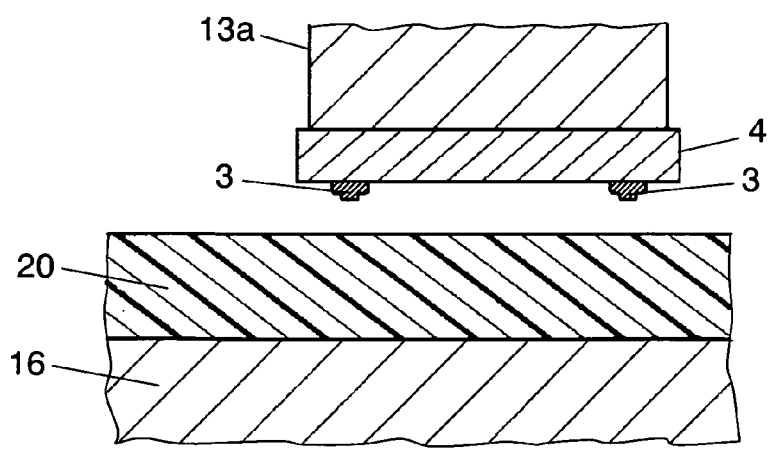
FIG. 16 shows a sectional view illustrating a step of the manufacturing method of the circuit board in accordance with the third embodiment, where an electronic component is sucked and held by a chuck. The electronic component in this state is press-fitted into resin film placed on a base-plate.

First, as shown in FIG. 16, place resin film 20, which is to be insulating resin layer 2, on base plate 16. At this time, if film 20 is made from thermoplastic resin, heat film 20 via base plate 16 up to its softening point (step S31). If film 20 is made from thermosetting or photo-setting resin, use those resin as soft as they are. Then place electronic component 4 sucked by chuck 13a such that electrode terminals 3 of component 4 face film 20 (step S32), and move chuck 13a downward in order to press-fit component 4 into film 20.

Figure 17:
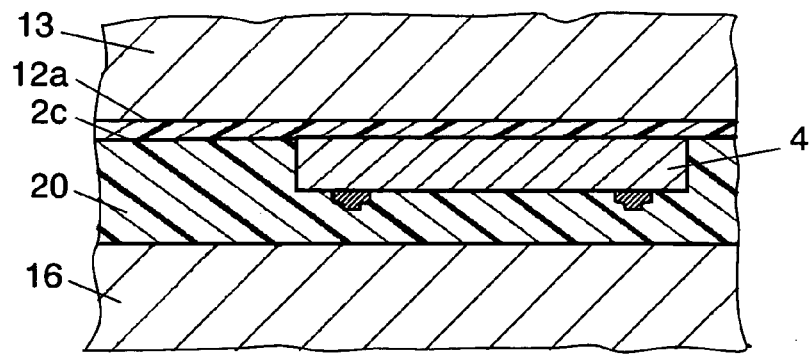
FIG. 17 shows a sectional view illustrating a step of the manufacturing method of the circuit board in accordance with the third embodiment, where the electronic component is further press-fitted into the resin film via mold releasing paper.
Figure 18:
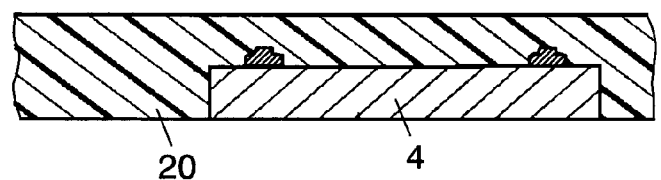
FIG. 18 shows a sectional view illustrating a step of the manufacturing method of the circuit board in accordance with the third embodiment, where a base-plate and a press head are removed, so that the resin film cured is peeled off and turned upside down.

After the press-fit of component 4 into film 20, place mold releasing paper 12a and press head 13 on component 4, and move press head 13 downward as shown in FIG. 17. This procedure allows press-fitting component 4 further into film 20 from back face 2c opposite to base plate 16 (step S33). If resin film 20 is made from thermoplastic resin, heat component 4 via press head 13 when the press-fit is done, and then cure film 20 (step S34). In other words, in the case of using thermoplastic resin film 20, cool press head 13 and base plate 16. If film 20 is made from thermosetting resin, heat press head 13 and base plate 16. In the case of using photo-setting resin film 20, irradiate film 20, e.g. with the light behind transparent base plate 16. Or, irradiate film 20 with the light just before the press-fit in order to start curing, and the cure is completed after the press-fit of component 4.

Figure 19:
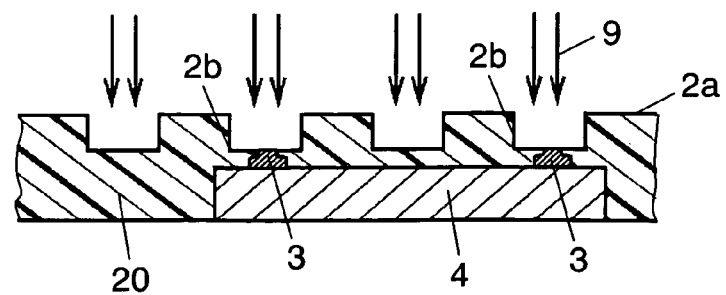
FIG. 19 shows a sectional view illustrating a step of the manufacturing method of the circuit board in accordance with the third embodiment, where grooves are formed at predetermined places correspondingly to a circuit pattern on the surface of the resin film.

After the cure of film 20, remove press head 13 and base plate 16 off resin film 20 as shown in FIG. 19, and turn film upside down. Then as shown in FIG. 19, remove surface 2a of film 20 until electrode terminals 3 are exposed, and form grooves 2b corresponding to circuit patterns (step S35). The surface is removed by such a process as plasma etching, beam irradiation of YAG laser or excimer laser, or electric-discharge machining. If resin film 20 is made from thermosetting resin, it is preferable to form grooves 2b by plasma etching which accompanies no heat. In FIG. 19, arrow mark 9 indicates, e.g. a laser beam of laser irradiation.

Then fill grooves 2b of film 20 with conductive paste 15 (step S36, refer to FIG. 9), and cure paste 15 by heating or photo irradiation for forming circuit patterns 5 (step S37). This procedure allows resin film 20 to become insulating resin layer 2 shown in FIG. 1, and circuit board 1 incorporating electronic component 4 is thus produced (refer to FIG. 1).

In the manufacturing steps of circuit board 1 shown in FIG. 15, firstly press-fit electronic component 4 into resin film 20, then form grooves 2b on film 20 by, e.g. plasma etching, as deep as electrode terminals 3 of component 4 are exposed. This structure allows terminals 3 to be positively conductive with circuit pattern 5. Thermosetting resin or photo-setting resin can be used as resin film 20 instead of thermoplastic resin. If electrode terminal 3 is flat, such as a plated bump, the foregoing manufacturing method allows terminal 3 to expose itself with ease from the bottom of groove 2b. Narrower pitches can be obtainable in the routings of circuit patterns 5. This is as a matter of course and similar to the method described in the first embodiment.

When film 20 made from thermosetting resin is used, step S34 for curing film 20 can be omitted, and curing both of conductive paste 15 and resin film 20 can be simultaneously done in step S37.

Instead of film 20 made from thermosetting resin or photo-setting resin, liquid thermosetting or liquid photo setting resin can be used. In this case, the liquid resin is applied on base plate 16 in advance, then the steps after step S32 shown in FIG. 15 are carried out.

Exemplary Embodiment 4

Figure 20:
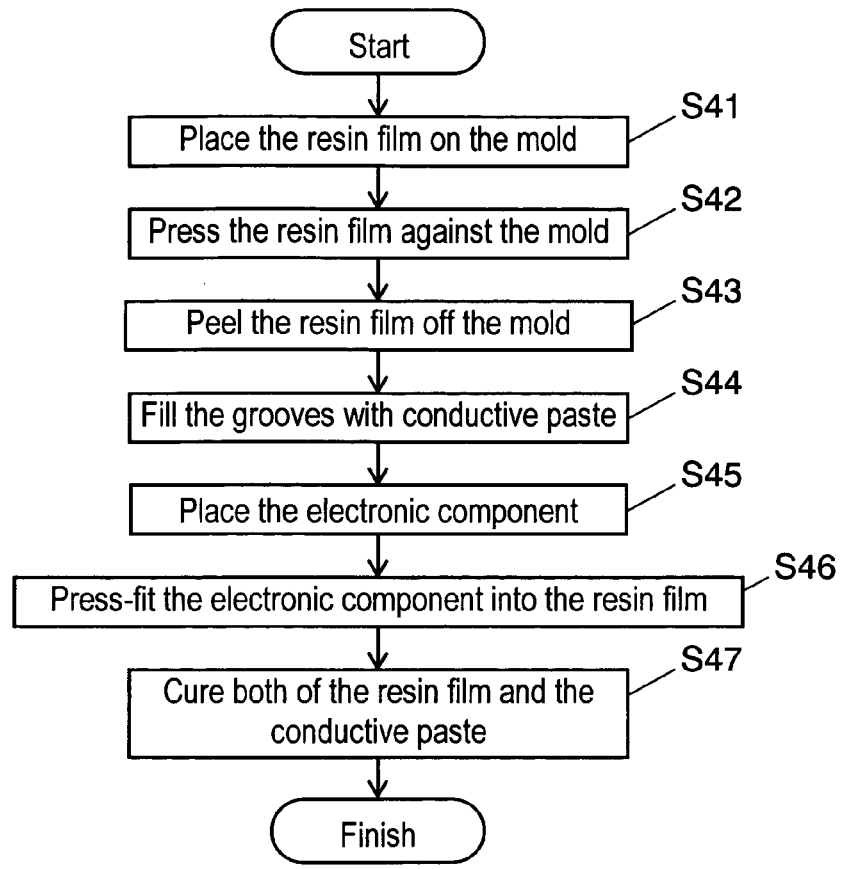
FIG. 20 shows a flowchart illustrating steps of a manufacturing method of a circuit board in accordance with a fourth exemplary embodiment of the present invention.
Figure 21:
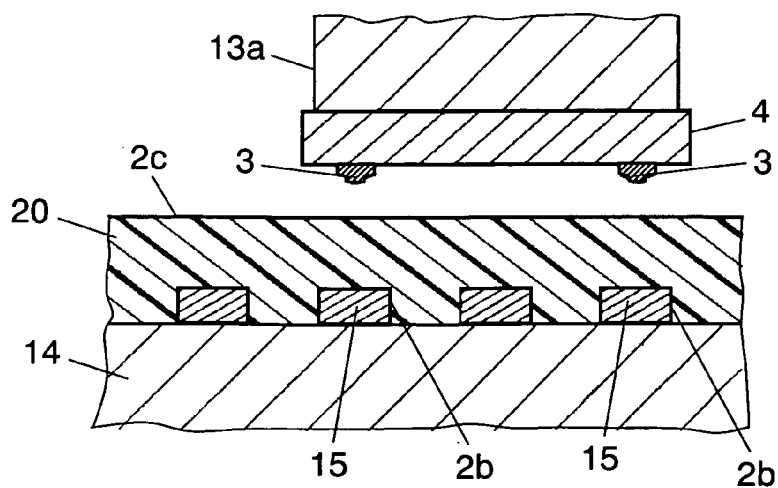
FIG. 21 shows a sectional view illustrating a step of the manufacturing method of the circuit board in accordance with the fourth embodiment, where grooves filled with conductive paste are turned downward, and an electronic component is press-fitted into resin film by a chuck.

The fourth exemplary embodiment of the present invention relates to a circuit board of which insulating resin layer is made from thermosetting resin or photo-setting resin, and it also relates to a method of manufacturing the same circuit board. The manufacturing method is demonstrated with reference to FIGS. 20 and 21. Steps common to those of the first and second embodiments are described with reference to FIGS. 3, 4, 12 and 14 already described. FIG. 20 shows a flowchart illustrating steps of the manufacturing method in accordance with the fourth embodiment. FIG. 21 shows a sectional view illustrating a step of the manufacturing method. Similar elements to those in the first through third embodiments have the same reference marks.

First, as shown in FIG. 3, place resin film 20 made from thermosetting or photo-setting resin between mold 10 and press head 11 via mold releasing paper 12 which is disposed between press head 11 and resin film 20 (step S41). This resin film 20 is eventually to become insulating resin layer 2. As shown in FIG. 4, press film 20 against mold 10 by press head 11 with a given pressure and for a given time (step S42). This structure allows forming grooves 2b, of which shape is reversal to that of projections 10a, on film 20.

Second, remove press head 11 and mold releasing paper 12a, and peel film 20 off mold 10 (step S43). As shown in FIG. 12, turn film 20 upside down, and fill grooves 2b formed on surface 2a of film 20 with conductive paste 15 (step S44).

As shown in FIG. 21, place film 20 on base plate 14 with its grooves 2b facing downward again, then place component 4 sucked by chuck 13a such that component 4 faces back-face 2c of film 20 (step S45). Move chuck 13a downward to press-fit component 4 into resin film 20.

After the press-fit of component 4, place press head 13 on component 4 via mold releasing paper 12a, and move press head 13 downward (refer to FIG. 14). Then further press-fit component 4 into film 20 from back-face 2c until electrode terminals 3 extends through film 20 and reaches the bottom of grooves 2b filled with conductive paste 15 (step S46). At this time, when film 20 made from thermosetting resin is used, heat press-head 13 and base-plate 14, thereby curing film 20 and thermosetting conductive paste 15 simultaneously. This procedure allows conductive paste 15 to form circuit patterns 5 (step S47) as shown in FIG. 14. When film 20 made from photo-setting resin is used, irradiate film 20 with ultraviolet ray just before component 4 is press-fitted, which cures film 20 after component 4 is press-fitted. In this case, if thermosetting conductive paste 15 is used, heat of base plate 14 will cure conductive paste 15. Conductive paste 15 having photo-setting property can be also used. In this case, photo-setting resin film 20 and paste 15 can be cured simultaneously.

The foregoing manufacturing method shown in FIG. 20 can achieve a narrower pitch between the routings of the circuit patterns, and yet, obtain circuit board 1 incorporating electronic component 4. Resin film 20 and conductive paste 15 are simultaneously cured, so that the manufacturing time can be shortened.

Exemplary Embodiment 5

Figure 22:
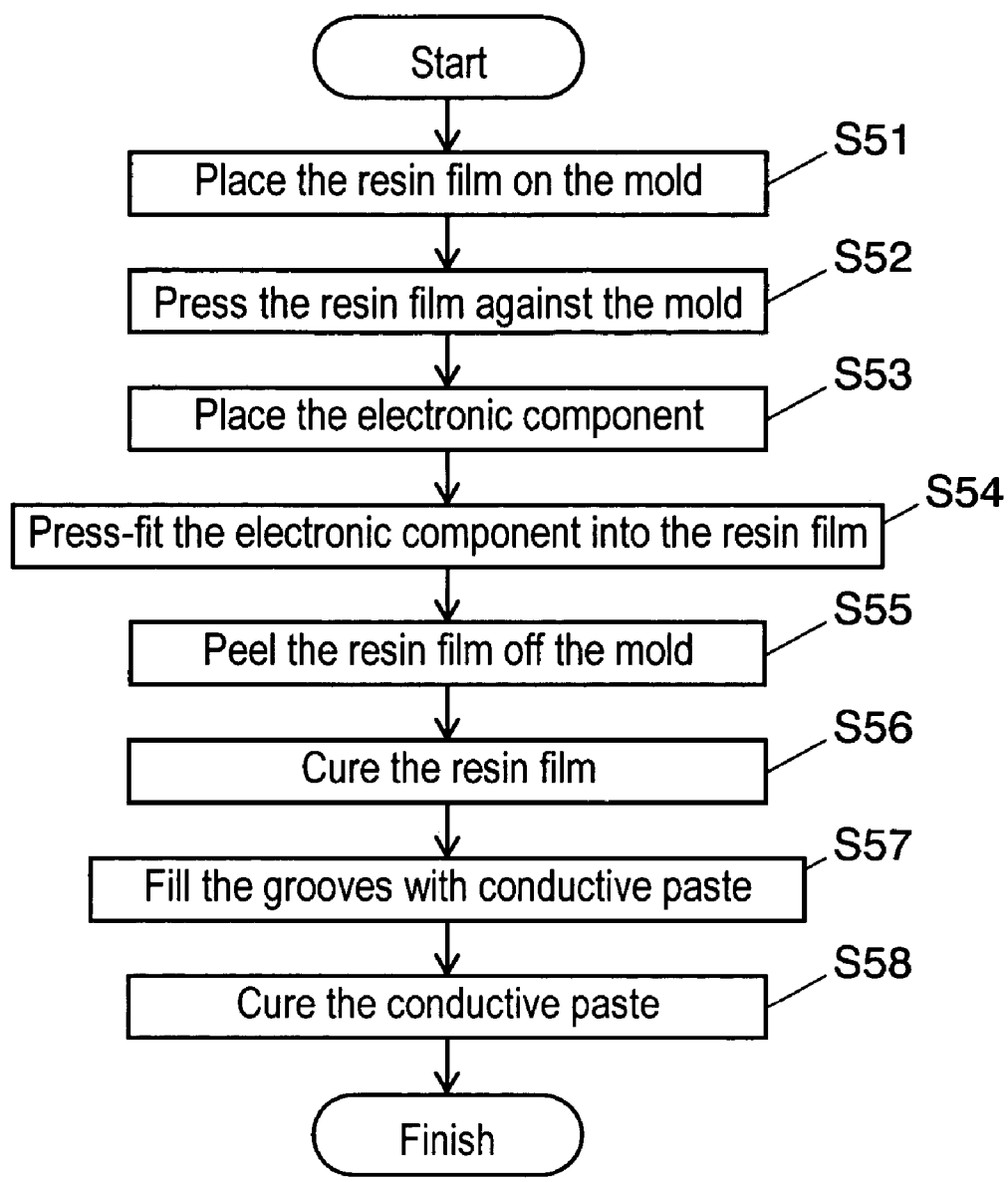
FIG. 22 shows a flowchart illustrating steps of a manufacturing method of a circuit board in accordance with a fifth exemplary embodiment of the present invention.

The fifth exemplary embodiment of the present invention relates to a circuit board of which insulating resin layer is made from thermosetting resin or photo-setting resin, and it also relates to a method of manufacturing the same circuit board. The manufacturing method is demonstrated with reference to FIG. 22. Steps common to those of the first embodiment will be demonstrated with reference to FIGS. 3, 4, 6 and 9 already described. FIG. 22 shows a flowchart illustrating steps of the manufacturing method in accordance with the fifth embodiment. Similar elements to those in the first through fourth embodiments have the same reference marks.

First, as FIGS. 3 and 4 shows, place resin film 20 made from thermosetting or photo-setting resin on mold 10, and press film 20 against mold 10 by press head 11. This procedure allows forming grooves 2b of which shape is reversal to that of projection 10a of mold 10 (steps S51, S52). This resin film 20 is eventually to become insulating rein layer 2.

Second, as shown in FIG. 6, place electronic component 4 sucked by chuck 13a such that component 4 faces back-face 2c of insulating resin layer 2 (step S53). Then move chuck 13a downward to press-fit component 4 into film 20. After the press-fit, as shown in FIG. 7, move press-head 13 downward via mold releasing paper 12a, thereby press-fitting component 4 further into film 20 from back-face 2c until electrode terminals 3 of component 4 expose themselves from the bottom of grooves 2b (step S54). Then peel film 20 off mold 10, and cure film 20 (step S55, S56). To be more specific, when film 20 made from thermosetting resin is used, heat film 20. When film 20 made from photo-setting resin is used, irradiate film 20 with the light.

Next, as shown in FIG. 8, turn film 20 upside down, and fill grooves 2b with conductive paste 15 (step S57). Then cure paste 15 by heating or photo irradiation to form circuit patterns 5 (step S58).

The foregoing manufacturing method shown in FIG. 22 cures film 20 first, and then cures conductive paste 15. This procedure allows obtaining a stable shape of grooves 2b even if film 20 is peeled off mold 10 before film 20 is cured.

As discussed above, several methods of manufacturing circuit board 1, which has circuit patterns 5 formed in grooves 2b and incorporates electronic component 4, are described. A method out of the foregoing methods is selected appropriately to a thickness of circuit board 1, easiness of handling board 1, and environment of board 1. Whichever method is selected, since circuit patterns 5 are formed in grooves 2b, a narrower pitch between the routings of circuit patterns 5 is achievable. Some steps can be carried out simultaneously as discussed above, so that the manufacturing time can be shortened. The present invention is not limited only to the exemplary embodiments previously discussed; however, various modifications are available within the scope of the present invention.

A sectional shape of groove 2b is rectangular in the foregoing descriptions; however, the shape can be another shape, e.g. semicircle. In the foregoing descriptions, resin film 20 is used for forming insulating resin layer 2; however, a resin board can be used depending on a shape of electronic component 4.

In the foregoing descriptions, insulating resin layer 2 of circuit board 1 has a single layer; however, circuit board 1 as a part of multi-layered board can be manufactured. For instance, in FIG. 1, another circuit pattern coupled to circuit pattern 5 can be formed on surface 2a, or another electronic component can be mounted on surface 2a. Further, a reinforcing resin board can be bonded to a top surface or underside of circuit board 1. In this case, the reinforcing resin board can be bonded to the insulating resin layer just after circuit patterns 5 are formed, or just after component 4 is press-fitted.

The foregoing embodiments describe a method of forming circuit patterns in grooves 2b by using conductive paste 15; however, the circuit patterns can be formed by another method. For instance, a film is formed in grooves 2b by plating or sputtering for forming a circuit pattern. This method allows increasing adhesion strength between the circuit patterns and insulating resin layer 2, so that micro-routings are achievable with ease.

The present invention, as discussed above, brings electrodes of an electronic component press-fitted into an insulating resin layer positively into conduction with routings of circuit patterns formed in recesses on the surface of the insulating resin layer. As a result, a narrower pitch between the routings of the circuit patterns is achievable. Therefore, the circuit board and the manufacturing method of the same board of the present invention can be widely applicable to circuit boards incorporating electronic components and manufacturing methods of those boards.

What is claimed is:

1. A circuit board comprising:
    an insulating resin layer having a plurality of grooves, which corresponds to a circuit pattern, on a surface of the layer;
    an electronic component disposed inside the insulating resin layer and having an electrode terminal exposed from a bottom one of the grooves; and
    the circuit pattern formed of a conductive layer in the groove so that the one of the grooves extends from the electrode terminal along the surface and to a further electrode terminal away from said surface,
    wherein the electrode terminal is electrically connected with the conductive layer and the electrode terminal includes a top surface and a bottom surface opposite the top surface, the top surface in contact with the conductive layer and the bottom surface in contact with the electronic component.

2. The circuit board of claim 1, wherein the circuit pattern comprising the conductive layer formed by curing conductive paste filled in the groove.

3. The circuit board of claim 1, wherein the insulating resin layer is formed of a material selected from the group consisting of thermoplastic resin, thermosetting resin and photo-setting resin.

4. The circuit board of claim 1, wherein the electrode terminal of the electronic component is shaped like a protrusion.

5. The circuit board of claim 1, wherein the electrode terminal and the further electrode terminal are both disposed on a same side of the conductive layer.

6. The circuit board of claim 1, wherein both the electrode terminal and the further electrode terminal are directly disposed on the conductive layer.

* * * * *